Jan. 27, 1959 C. R. HURTIG 2,871,305

CONSTANT IMPEDANCE TRANSISTOR INPUT CIRCUIT

Filed June 1, 1956

INVENTOR.
CARL R. HURTIG
BY
Harry M. Saragovitz
ATTORNEY 2,871,305

CONSTANT IMPEDANCE TRANSISTOR INPUT CIRCUIT

Carl R. Hurtig, Greenbush, Mass., assignor to the United States of America as represented by the Secretary of the Army Application June 1, 1956, Serial No. 588,934

7 Claims. (Cl. 179—171)

This invention relates to transistor circuits and particularly to means for improving the input characteristics of such circuits.

It is well known that variation of transistor parameters with D. C. bias conditions may be employed to control the gain of a transistor amplifier stage. There are, however, applications that require a gain that may be varied by an external voltage and yet require that the input and output impedance parameters remain constant. While output impedance may be held reasonably constant by the expedient of using an effective load impedance which is small compared to the normally relatively large collector resistance, this method will not work as regards the input circuit since the emitter resistance is relatively low.

It is an object of this invention to provide transistor circuits which under conditions of variable gain will offer a more constant input impedance.

In accordance with the invention a grounded base transistor stage is provided with a compensating impedance between the emitter and base which increases as a function of emitter current. Since emitter resistance is an inverse function of emitter current, the net resistance between emitter and base may be held more constant despite varying emitter bias and consequent varying emitter current and amplification.

For a better understanding of the invention, together with other and further objects thereof, reference is had to the following description taken in connection with the accompanying drawings, in which.

Figure 1:
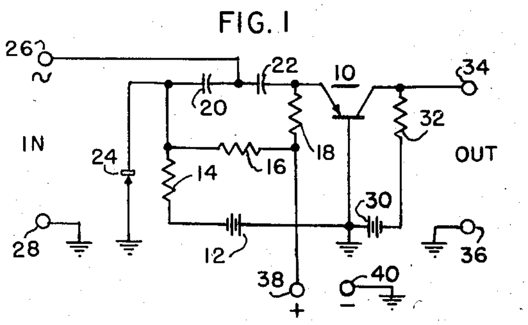
Figure 1 is a schematic diagram of a basic embodiment of the invention.

In Figure 1, PNP transistor 10 is shown connected in a grounded base configuration. Bias source 12 is connected with positive terminal connected to ground and negative terminal connected through fixed bias resistor 14 to the base terminal of a semiconductor diode 24, which may be a silicon diode. As used in the specification and claims the terminals of the diode are referred to as base and emitter, with the forward direction of conduction being from emitter to base. Series capacitors 20 and 22 are connected between the base terminal of diode 24 and the transistor emitter to provide A. C. passing but D. C. blocking connections. Gain control input terminal 38 is connected to the base of diode 24 through diode resistor 16, and to the emitter of transistor 10 through emitter resistor 18. The emitter of diode 24, control voltage input terminal 40, and the base of transistor 10 are connected to ground. Signal input terminals 26 and 28 are connected between ground and the junction of capacitors 20 and 22. Collector bias source 30 is connected with positive terminal grounded and negative terminal connected through resistor 32 to the collector of transistor 10. Output terminals 34 and 36 are connected between the collector and ground.

It will be noted that bias source 12 is so connected that diode 24 is biased in the forward direction. A positive control voltage at terminal 38, applied to the diode base and transistor emitter will have opposite effects. The emitter resistance of the transistor will be decreased and the diode resistance will be increased. Since the emitter and diode appear in parallel to the input, the complementary changes in resistance tend to produce a net constant input impedance. As a result the gain may be varied by a varying positive control voltage applied to terminal 38, while maintaining a relatively constant input impedance.

Figure 2:
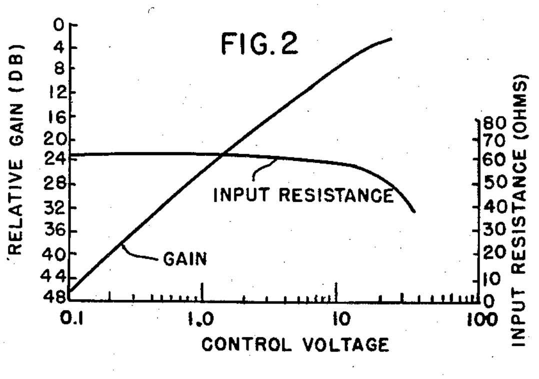
Figure 2 is a graph illustrating the performance of the circuit in Figure 1.

In the graph in Figure 2, gain and input resistance of the circuit in Figure 1 are plotted as a function of control voltage. Gain in decibels appears as a linear function of logarithmic changes in control voltage within an accuracy of 10% over a range of at least 40 db, while the input resistance varies by less than 10%.

Figure 3:
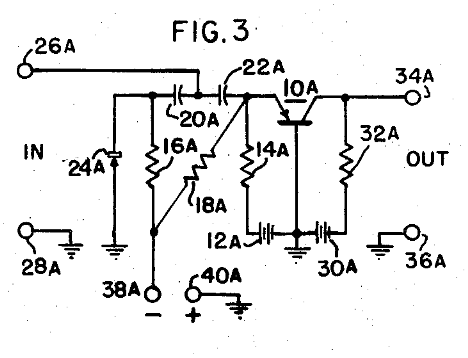
Figure 3 is a schematic circuit of second embodiment of the invention.

The circuit shown in Figure 3 is designed for application of a negative control voltage for gain reduction with increase in control voltage. Being similar to Figure 1, like parts bear like reference numerals but with the suffix A. Figure 3 differs from Figure 1 in the following respects: fixed forward bias source 12A is connected in reverse polarity with respect to ground and is applied through fixed bias resistor 14A to the emitter of transistor 10A instead of to the base of the diode, and the control voltage applied to the terminal 38A must be negative with respect to grounded terminal 40A. In operation, as the negative control voltage is increased, transistor gain decreases, the emitter resistance increases, and the diode resistance decreases. The result is a negative voltage control, variable gain stage which does not vary appreciably in input impedance with variation in gain.

Figure 4:
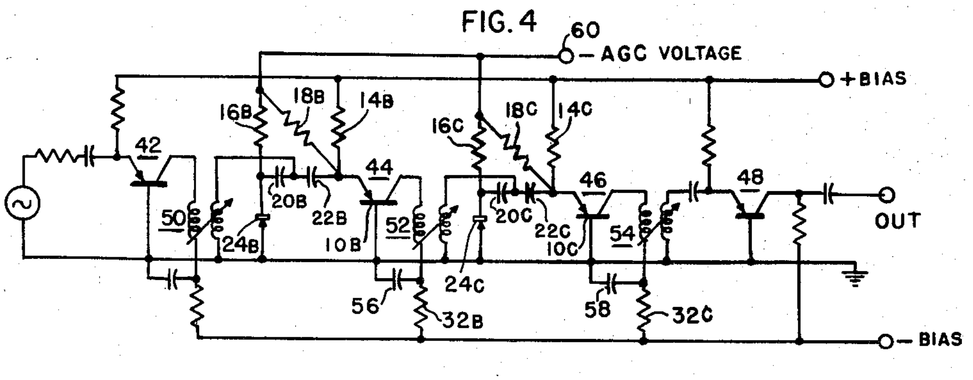
Figure 4 is a schematic diagram of the invention employed in an intermediate frequency amplifier.

An application of the gain reduction circuit shown in Figure 3 is illustrated in the intermediate frequency (I. F.) amplifier circuit in Figure 4. As shown it consists of a driving stage 42, two I. F. amplifier stages 44 and 46, and output stage 48, interstage coupled by I. F. transformers 50, 52, and 54. I. F. stages 44 and 46 each contain the basic circuit shown in Figure 3 and the elements reappearing bear the same reference numerals with the suffix B added in stage 44 and C added in stage 46. Parallel to diode 24B is the secondary coil of I. F. transformer 50 and parallel to diode 24C is the secondary coil of I. F. transformer 52. In series with load resistor 32B is the primary coil of I. F. transformer 52 and in series with load resistor 32C is the primary coil of I. F. transformer 54. Bypass capacitors 56 and 58 connect the grounded base elements of transistors 10B and 10C, respectively, to the ground potential side of the primary coil of the I. F. transformer with which they are associated. In this circuit the control signal is the conventional negative automatic gain control voltage and it is shown applied at terminal 60 and connected to I. F. stages 44 and 46. The operation is the same as previously discussed for Figure 3 and as the negative control voltage changes the gain of the stages, the compensating circuit prevents the input resistance from changing. This characteristic makes possible the use of automatic or manual gain control in tuned stages without the usual variation in bandwidth with gain level due to shifting circuit Q caused by shifting input resistances.

Figure 5:
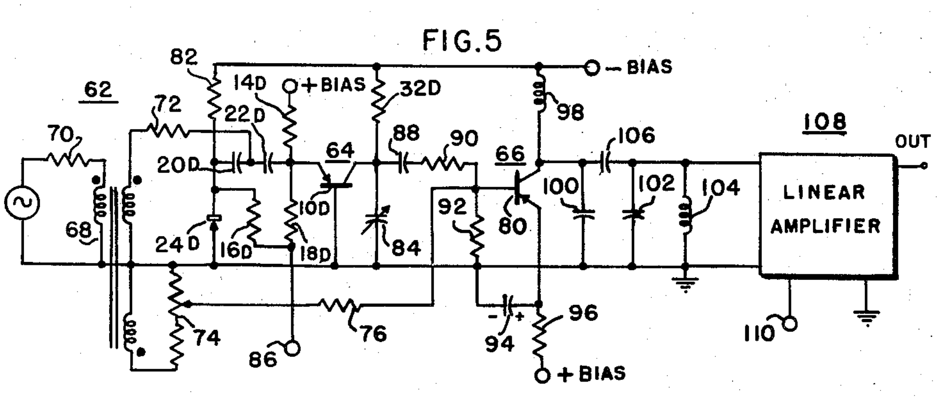
Figure 5 is a schematic diagram embodying a balanced modulator type of circuit employing the invention.

Figure 5 shows a combination of two linear amplifiers employing the invention and designed to perform electrical multiplication. The first amplifier, shown in detail, is of the balanced modulator type and consists of a transformer phase inverter circuit 62, followed by a constant input impedance grounded base transistor stage 64, in turn followed by grounded emitter transistor mixer stage 66.

The phase inverter circuit 62 consists of phase inverter transformer 68 having a primary winding and two secondary windings. One end of each winding is grounded. The input carrier signal is applied to the ungrounded end of the primary winding through resistor 70. The output from the first secondary winding is fed through resistor 72 to the connection between capacitors 20D and 22D in constant input impedance stage 64. The opposite phase output from transformer 68 is taken from the adjustable tap of potentiometer 74 connected across the second secondary winding. This output is connected through resistor 76 to the base of transistor 80 in the second transistor stage 66.

The constant input impedance stage 64 is similar to the circuit shown in Figure 3. Like circuit elements bear like reference numerals with a D suffix. The only material alteration in circuitry is in the inclusion of an additional fixed negative bias which is applied to the base of diode 24D through resistor 82. With this provision either positive or negative control voltages may be applied with input resistance compensation, since both diodes, 24D and the emitter-base diode of transistor 10D, are biased to conduct. Balance-tuning capacitor 84 has been added and is connected between the collector of transistor 10D and ground. Control voltage input terminal 86 for receiving either A. C. or D. C. signals is connected as in Figure 3.

The collector of first stage transistor 10D is connected to the base of the second stage transistor 80 by series capacitor 88 and resistor 90. The received input voltage on the second stage appears across resistor 92, connected between base and ground, and the portion of potentiometer 74 in parallel therewith between the adjustable tap and ground. The emitter of transistor 80 is connected to ground through capacitor 94 and D. C. biased positive through resistor 96. Negative collector bias is supplied through load inductance 98. Capacitor 100, as a part of the load circuit is connected between collector and ground. Capacitor 102 and inductance 104 are connected in parallel as a load across the output through capacitor 106 between ground and collector. The output is fed to the input of a second linear amplifier 108. Terminal 110 connected to amplifier 108 is provided to receive a control or modulation signal. This second amplifier may be of the same type as the one preceding it.

In operation, assume that a carrier frequency is applied across the primary of transformer 68. Without a modulation control signal on terminal 86, the opposing voltages from the transformer secondary impressed on the common input load to the second stage by adjustment of the potentiometer may be balanced out. With this done and a modulation control signal impressed on terminal 86, the resulting modulated output of the second stage will be a substantially linear function of both input carrier and modulation signals. If two amplifiers are combined in cascade, as shown in Figure 5, and modulation signals proportional to two digits are impressed on the control voltage input terminals of each amplifier, i. e., terminals 86 and 110, respectively, the output of the second amplifier will be a substantially linear function of both digits.

What is claimed is:

1. A translating circuit comprising a PNP transistor connected in grounded base configuration, a semiconductor diode, a D. C. bias source, a pair of terminals adapted to receive a D. C. control voltage, a capacitive connector, first, second, and third resistors, the base of said transistor and the emitter of said diode being connected in common, the emitter of said transistor and the base of said diode being connected by said capacitive connector, a first D. C. path from one terminal of said capacitive connector through said emitter and base of said transistor to said connection, a second D. C. path from the other terminal of said capacitive connector through said diode to said connection, one terminal of said D. C. bias source being connected to said connection and the other terminal being connected to one terminal of said capacitive connector through said first resistor, the bias source being polarized to forward bias the associated D. C. path, one of said control voltage terminals being connected to said connection and the other being connected through said second resistor to the emitter of said transistor and through said third resistor to the base of said diode, and a pair of input terminals connected between said transistor emitter and said common connection, one of said terminals being capacitively connected.

2. A translating circuit comprising a PNP transistor connected in grounded base configuration, a semiconductor diode, a D. C. bias source, a pair of terminals adapted to receive a D. C. control voltage, first and second capacitors, first, second, and third resistors, a pair of input terminals, the base of said transistor and the emitter of said diode being connected to a common terminal, the emitter of said transistor connected to a first lead of said first capacitor, the base of said diode being connected to a first lead of said second capacitor, the second leads of said capacitors being connected to one of said pair of input terminals, the other lead of said pair of input terminals being connected to said common terminal, a first D. C. path from the first lead of said first capacitor through the emitter and base of said transistor to said common terminal, a second D. C. path from the first lead of said second capacitor through said diode to said common terminal, one terminal of said D. C. bias source being connected to said common terminal and the other terminal of said bias source being connected through said first resistor to the first lead of one of said capacitors, the bias source being polarized to forward bias the associated D. C. path, one of said control voltage terminals being connected to said common terminal and the other being connected through said second resistor to the emitter of said transistor and through said third resistor to the base of said diode.

3. A translation circuit as set forth in claim 2, wherein the negative terminal of said bias source is connected through said first resistor to the connection between the base of said diode and said capacitors.

4. A translation circuit as set forth in claim 2, wherein the positive terminal of said bias source is connected through said first resistor to the said connection between the emitter of said transistor and said capacitors, a collector bias source and a collector load resistor, the positive terminal of said collector bias source being connected to said common terminal and the negative terminal being connected through said load resistor to the collector of said transistor, and a pair of output terminals connected between said collector and said common terminal.

5. A translating circuit comprising a PNP transistor connected in grounded base configuration, a semiconductor diode, a pair of terminals adapted to receive a D. C. control voltage, a capacitive connector, a first, second, third and four resistors, the base of said transistor and the emitter of said diode being connected to a common connection, the emitter of said transistor and the base of said diode being connected by said capacitive connector, a negative terminal with respect to said common connection being connected through said first resistor to the base of said diode and a positive terminal with respect to said common connection being connected through said second resistor to the emitter of said transistor, one of said control voltage terminals being connected to said common connection, and the other being connected through said third resistor to the emitter of said transistor and through said fourth resistor to the base of said diode, and a pair of input terminals connected between said transistor emitter and said common connection, one of said terminals being capacitively connected.

6. A transistor circuit having an input and output, the input of which comprises a transistor emitter-base diode, a semiconductor input diode, one terminal of each diode being connected as a common input connection, a capacitive connector, the remaining free terminals of said diodes being interconnected by said capacitive connector, said diodes being poled oppositely between said common connection and said capacitive connector, means to apply a fixed forward bias to one of said diodes, and means for applying a variable D. C. bias to forward bias the other of said diodes and for applying an equal but reverse variable bias to said diode biased with a fixed bias.

7. A translating circuit comprising a grounded base connected transistor having a common input-output connection to the transistor base and an input circuit comprising, a semiconductor input diode, one terminal of said diode being connected to said common connection and the other terminal of said diode being connected to the emitter of said transistor through a capacitive connector, said input diode and the emitter-base diode of said transistor being poled oppositely between said common connection and said capacitive connector, a first and second input biasing source each having relative positive and negative terminals, the positive terminal of one source of the negative terminal of the other source being connected to said common connection, first, second and third resistors, one of the remaining free biasing terminals being connected through said first resistor to one terminal of said capacitive connector such that one of said diodes is poled to permit forward biasing by the connection, the remaining free biasing source terminal being connected through said second resistor to the other terminal of said capacitive connector, and through said third resistor to said one terminal of the capacitive connector, and a pair of input terminals connected between said one terminal of said capacitive connector and said common connection, at least one of said input terminals being capacitively connected.

References Cited in the file of this patent

UNITED STATES PATENTS

| | | |
|---|---|---|
| 2,666,818 | Shockley | Jan. 19, 1954 |
| 2,802,067 | Zawels | Aug. 6, 1957 |
| 2,808,474 | Maynard et al. | Oct. 1, 1957 |
| 2,810,024 | Stanley | Oct. 15, 1957 |

OTHER REFERENCES

Caruthers article, "Some Experimental etc.," The Transistor, pp.401, 402, 409, published by Bell Tel. Lab., 1951. Copy in Class. Div. II.